(12) United States Patent
Lim et al.

(10) Patent No.: US 11,069,763 B2
(45) Date of Patent: *Jul. 20, 2021

(54) DISPLAY APPARATUS

(71) Applicant: Samsung Display Co., Ltd., Yongin-si (KR)

(72) Inventors: Hyungchul Lim, Hwaseong-si (KR); Wonho Kim, Seongnam-si (KR); Keunsoo Lee, Hwaseong-si (KR); Jeongho Lee, Seoul (KR); Yanghee Kim, Yongin-si (KR); Soyeon Park, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 103 days.

This patent is subject to a terminal disclaimer.

(21) Appl. No.: 16/455,450

(22) Filed: Jun. 27, 2019

(65) Prior Publication Data

US 2019/0320150 A1  Oct. 17, 2019

Related U.S. Application Data

(63) Continuation of application No. 16/053,458, filed on Aug. 2, 2018, now Pat. No. 10,374,028.

(30) Foreign Application Priority Data

Jan. 3, 2018 (KR) .......................... 10-2018-0000952

(51) Int. Cl.
*H01L 27/32* (2006.01)
*H01L 51/00* (2006.01)
(Continued)

(52) U.S. Cl.
CPC ....... *H01L 27/3276* (2013.01); *G09G 3/3406* (2013.01); *G09G 3/3614* (2013.01);
(Continued)

(58) Field of Classification Search
CPC ............. H01L 27/3276; H01L 27/3223; H01L 27/3258; H01L 27/3262; H01L 51/0097;
(Continued)

(56) References Cited

U.S. PATENT DOCUMENTS

| 2005/0046033 A1 | 3/2005 | Chung et al. |
| 2016/0093644 A1 | 3/2016 | Ki et al. |

(Continued)

FOREIGN PATENT DOCUMENTS

KR   10-2015-0023072   3/2015

*Primary Examiner* — Anne M Hines
(74) *Attorney, Agent, or Firm* — Lewis Roca Rothgerber Christie LLP

(57) ABSTRACT

A display apparatus including a display panel including a base substrate and a first pad electrode on a first pad portion of the base substrate, a flexible substrate connected to the first pad portion, and a driving chip electrically connected to the flexible substrate. The flexible substrate includes a first film layer, a first wiring layer on the first film layer and comprising a plurality of wirings, a second film layer on the first wiring layer, and a second wiring layer on the second film layer and comprising a plurality of wirings. The wirings of the second wiring layer include a first_first wiring and a first_second wiring, the first_first wiring and the first_second wiring extend in a same direction along a same line and are spaced from each other by a gap therebetween. The gap is at an edge of the base substrate in a plan view.

13 Claims, 9 Drawing Sheets

(51) Int. Cl.
*H05K 1/00* (2006.01)
*G09G 3/34* (2006.01)
*G09G 3/36* (2006.01)
*H04N 9/31* (2006.01)
*H01L 27/12* (2006.01)
*G09G 3/20* (2006.01)
*H01L 23/498* (2006.01)
*H01L 23/52* (2006.01)
*H01L 23/00* (2006.01)
*H01L 33/36* (2010.01)
*H01L 33/62* (2010.01)

(52) U.S. Cl.
CPC ...... *H01L 27/3223* (2013.01); *H01L 27/3258* (2013.01); *H01L 27/3262* (2013.01); *H01L 51/0097* (2013.01); *H04N 9/312* (2013.01); *H04N 9/3108* (2013.01); *H04N 9/3123* (2013.01); *H04N 9/3155* (2013.01); *H04N 9/3164* (2013.01); *H04N 9/3179* (2013.01); *H05K 1/00* (2013.01); *G09G 3/2014* (2013.01); *G09G 3/3618* (2013.01); *G09G 2320/0233* (2013.01); *G09G 2320/0646* (2013.01); *H01L 23/4985* (2013.01); *H01L 23/52* (2013.01); *H01L 24/69* (2013.01); *H01L 27/124* (2013.01); *H01L 27/1248* (2013.01); *H01L 33/36* (2013.01); *H01L 33/62* (2013.01); *H01L 2224/16225* (2013.01); *H01L 2251/5338* (2013.01); *H04N 9/3126* (2013.01)

(58) Field of Classification Search
CPC ... G09G 3/3406; G09G 3/2014; G09G 3/3618
See application file for complete search history.

(56) References Cited

U.S. PATENT DOCUMENTS

| | | |
|---|---|---|
| 2016/0179229 A1 | 6/2016 | Ahn |
| 2016/0242295 A1 | 8/2016 | Kim |
| 2017/0194383 A1 | 7/2017 | Liu et al. |
| 2018/0123060 A1 | 5/2018 | Jang et al. |
| 2019/0006549 A1 | 1/2019 | Yim et al. |

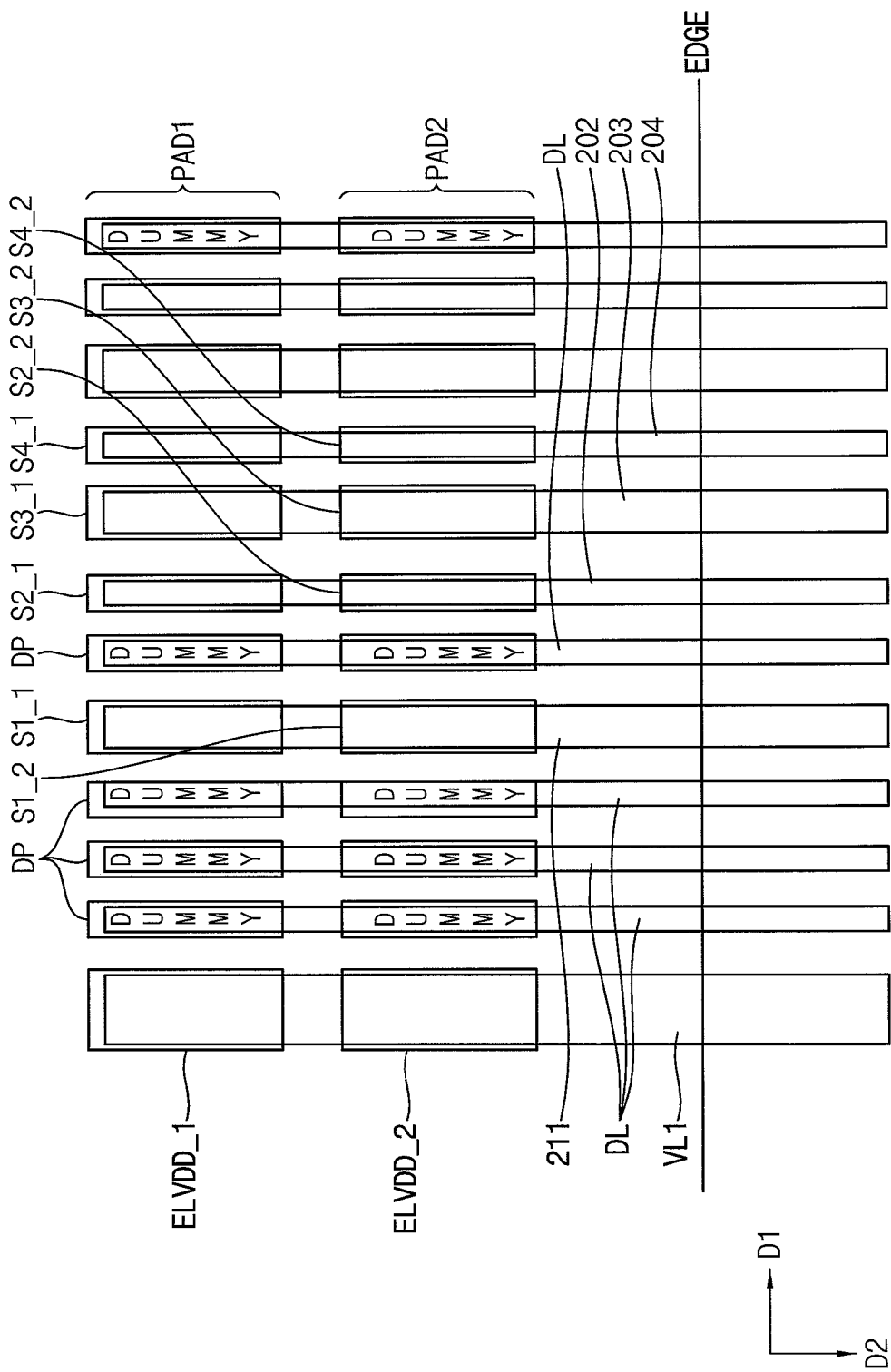

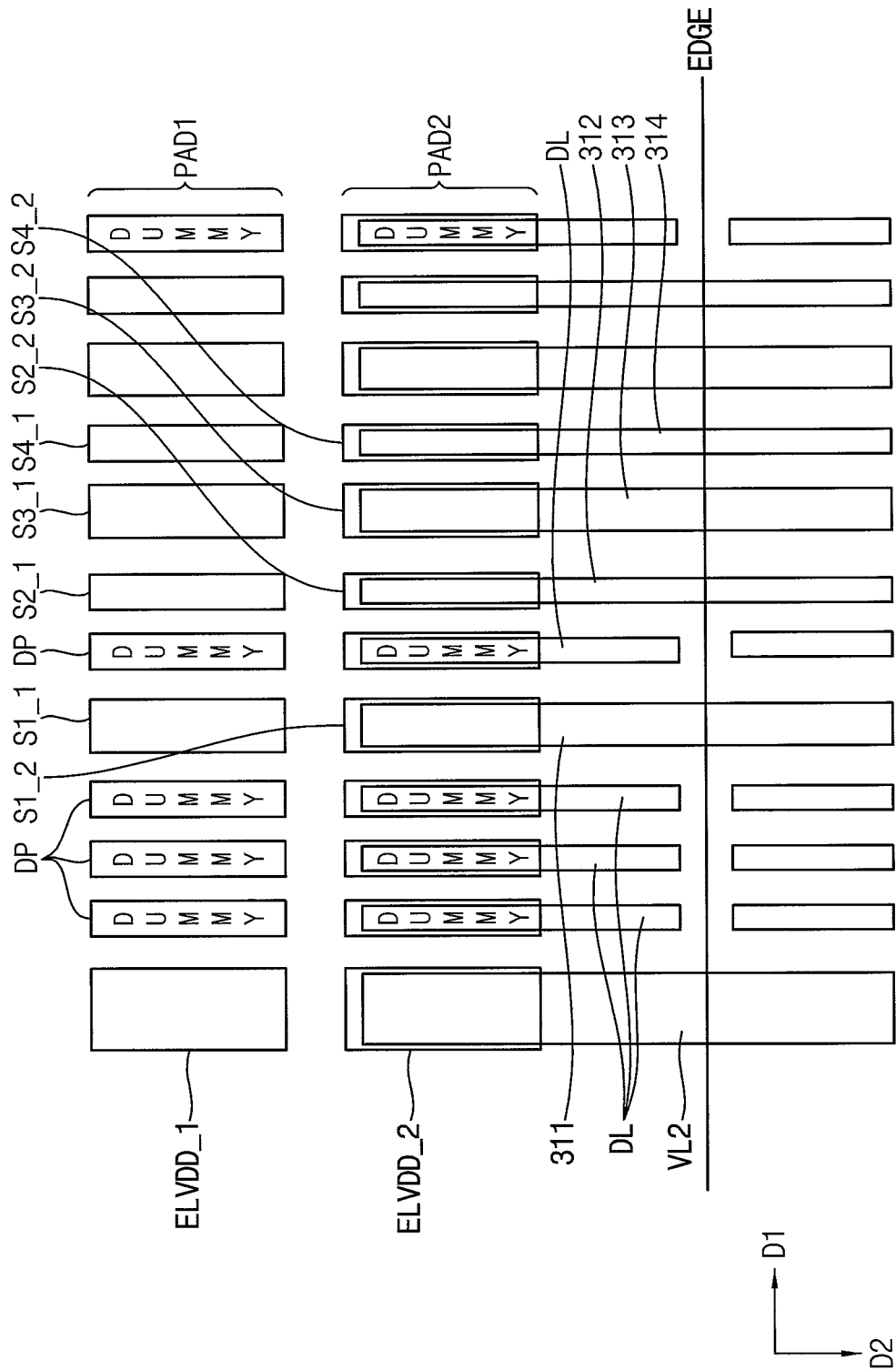

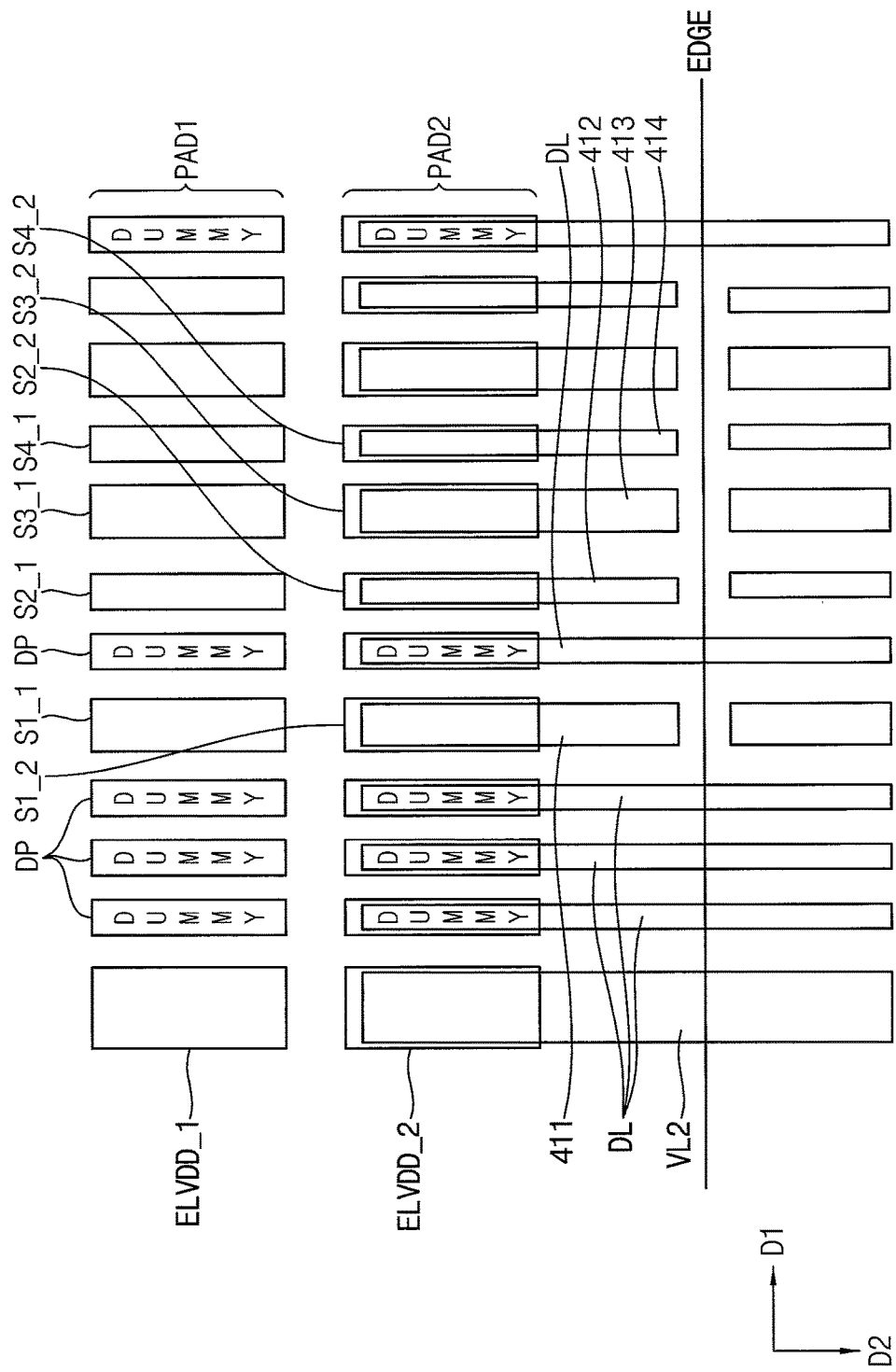

DISPLAY APPARATUS

CROSS-REFERENCE TO RELATED APPLICATION

This application is a continuation of U.S. patent application Ser. No. 16/053,458, filed Aug. 2, 2018, which claims priority to and the benefit of Korean Patent Application No. 10-2018-0000952, filed on Jan. 3, 2018 in the Korean Intellectual Property Office, the disclosure of all of which is incorporated by reference herein in its entirety.

BACKGROUND

1. Field

Example embodiments of the present invention relate to a display apparatus.

2. Description of the Related Art

Recently, display apparatuses having relatively light weight and small size have been developed. A cathode ray tube (CRT) display apparatus has been used previously due to its performance and having a competitive price. However, the CRT display apparatus has a relatively large size and low portability. Therefore, more recent display apparatuses, such as a plasma display apparatus, a liquid crystal display apparatus, and an organic light emitting display apparatus, have been highly regarded due to their relatively small size, light weight, and low power consumption.

The display apparatus may include a display panel on which a pad portion is formed and a flexible substrate connected to the pad portion. However, a connection between the flexible substrate and the pad portion may be relatively poor and the flexible substrate may be damaged, resulting in relatively poor quality and/or poor display quality.

SUMMARY

Example embodiment of the present invention provide a display apparatus having an improved connection between a pad portion and a flexible substrate.

According to an example embodiment of the present invention, a display apparatus includes a display panel including a base substrate and a first pad electrode on a first pad portion of the base substrate, a flexible substrate connected to the first pad portion, and a driving chip electrically connected to the flexible substrate. The flexible substrate includes a first film layer, a first wiring layer on the first film layer and including a plurality of wirings, a second film layer on the first wiring layer, and a second wiring layer on the second film layer and including a plurality of wirings. The wirings of the second wiring layer include a first_first wiring and a first_second wiring. The first_first wiring and the first_second wiring extend in a same direction and along a same line, and the first_first wiring and the first_second wiring are spaced from each other by a gap therebetween. The gap is at an edge of the base substrate in a plan view.

The display apparatus may further include a conductive member including a plurality of conductive balls and may be between the flexible substrate and the first pad electrode. The second wiring layer may further include a first contacting portion contacting at least some of the conductive balls to be electrically connected to the first pad electrode.

The first pad portion may extend in a first direction. The display panel may further include a second pad electrode on a second pad portion of the base substrate. The second pad portion may be spaced from the first pad portion in a second direction perpendicular to the first direction, and the second pad portion may extend in the first direction. The second wiring layer may further include a second contacting portion contacting at least some of the conductive balls to be electrically connected to the second pad electrode. The first contacting portion may be electrically connected to at least some of the wirings of the first wiring layer through a contact opening formed through the second film layer. The second contacting portion may be a portion of the first_first wiring of the second wiring layer.

The wirings of the first wiring layer may overlap the edge of the base substrate in the plan view, and the wirings of the second wiring layer may not overlap the edge of the base substrate in the plan view.

The second wiring layer may further include a second wiring, and the second wiring may overlap the edge of the base substrate in the plan view.

The display panel may further include a dummy electrode in the second pad portion, the second wiring layer may further include a dummy line, and the dummy line may be electrically connected to the dummy electrode.

The second wiring layer my further include a first signal line and a second signal line, and the dummy line may be between the first signal line and the second signal line.

The dummy line may include a first dummy line and a second dummy line. The second dummy line may extend in a same direction as the first dummy line and along a same line. The first and second dummy lines may spaced from each other by a gap therebetween, and the gap between the first dummy line and the second dummy line may overlap the edge of the base substrate in the plan view.

In the plan view, the dummy line may overlap the edge of the base substrate.

The dummy electrode may include a first dummy electrode and a second dummy electrode. The dummy line may include a first dummy line electrically connected to the first dummy electrode and a second dummy line electrically connected to the second dummy electrode. The first_first wiring and the first_second wiring of the second wiring layer may be between the first dummy line and the second dummy line.

The first dummy electrode may include a first_first dummy electrode and a first_second dummy electrode. The first_second dummy electrode may extend in a same direction and along a same line as the first_first dummy electrode. The second dummy electrode may include a second_first dummy electrode and a second_second dummy electrode. The second_second dummy electrode may extend in a same direction and along a same line as the second_first dummy electrode.

The first dummy line may include a first_first dummy line and a first_second dummy line. The first_second dummy line may extend in a same direction and along a same line as the first_first dummy line. The first_first dummy line and the first_second dummy line may be spaced from each other by a gap, and the gap between the first_first dummy line and the first_second dummy line may overlap the edge of the base substrate. The second dummy line may include a second_first dummy line and a second_second dummy line. The second_second dummy line may extend in a same direction and along a same line as the second_first dummy line. The second_first dummy line and the second_second dummy line may be spaced from each other by a gap, and the gap between the second_first dummy line and the second_second dummy line may overlap the edge of the base substrate. The first wiring layer may overlap the edge of the base substrate in the plan view.

The base substrate may include polyimide.

The display apparatus may further include a covering part which covers a side surface of the display panel.

The flexible substrate may further include a third film layer on the second wiring layer.

The covering part may contact the third film layer.

The flexible substrate may further include a first power line to which a first power voltage is applied, and the first power line may overlap the edge of the base substrate in the plan view.

The display apparatus may further include a gate line on the base substrate, a first insulation layer on the gate line, a first SD layer on the first insulation layer, and a second insulation layer on the first SD layer and having an opening exposing the first lower pad electrode. The first SD lay may include a first lower pad electrode, and the second insulation layer may have an opening exposing the first lower pad electrode. The first lower pad electrode may be electrically connected to the gate line through a contact opening formed through the first insulation layer.

The display apparatus may further include a second SD layer and a third insulation layer on the second SD layer. The second SD layer may include a first upper pad electrode on the first lower pad electrode, and the third insulation layer may have an opening exposing the first upper pad electrode.

According to an example embodiment of the present invention, a display apparatus includes a display panel including a base substrate and a first pad electrode on a first pad portion of the base substrate, a flexible substrate connected to the first pad portion, and a driving chip electrically connected to the flexible substrate. The flexible substrate includes a first film layer, a first wiring layer on the first film layer and including a plurality of wirings, a second film layer on the first wiring layer, and a second wiring layer on the second film layer and including a plurality of wirings. At least one of the wirings of the second wiring layer includes a first wiring and a second wiring. The second wiring extends in a same direction and along a same line as the first wiring, and an edge of the base substrate is between the first wiring and the second wiring in a plan view.

According to example embodiments of the present invention, signal wirings and/or dummy lines of the second wiring layer adjacent to a side surface of the base substrate are cut at an area corresponding to the edge of the base substrate. Therefore, a short circuit between the signal wirings caused by, for example, damage to an insulation structure between the signal wirings due to a material, for example, a conductive material, flowing out from the side surface of the base substrate under high temperature and high humidity conditions can be prevented or mitigated.

In addition, the material (e.g., the conductive material) may be blocked from flowing by the dummy line. Accordingly, the above-described defects may be prevented or further mitigated.

It is to be understood that both the foregoing general description and the following detailed description are exemplary in nature and are not intended to limit the present invention.

BRIEF DESCRIPTION OF THE DRAWINGS

The above and other aspects and features of the present invention will become more apparent by describing, in detail, example embodiments thereof with reference to the accompanying drawings, in which:

FIG. 4B is a diagram illustrating a connection relationship of a second wiring layer of the flexible substrate at the area 'A' of FIG. 1;

FIG. 5A is a diagram illustrating a connection relationship of a first wiring layer of a flexible substrate of a display apparatus according to an example embodiment of the present invention;

FIG. 6A is a diagram illustrating a connection relationship of a first wiring layer of a flexible substrate of a display apparatus according to an example embodiment of the present invention;

DETAILED DESCRIPTION

Figure 1:
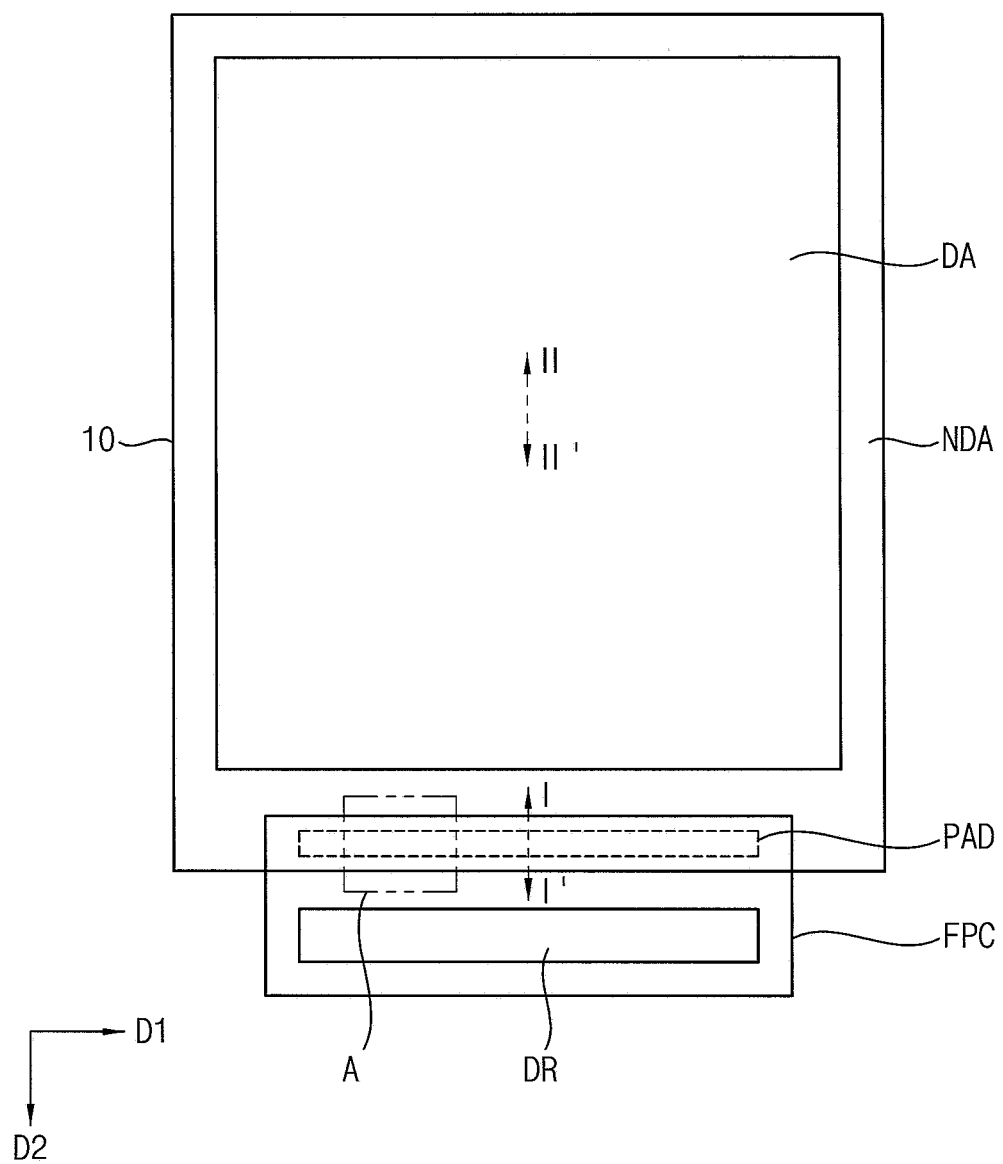
FIG. 1 is a plan view illustrating a display apparatus according to an example embodiment of the present invention.

Hereinafter, embodiments of the present invention will be explained in more detail with reference to the accompanying drawings.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

FIG. 1 is a plan view illustrating a display apparatus according to an example embodiment of the present invention.

Referring to FIG. 1, the display apparatus may include a display panel 10, a flexible substrate FPC, and a driving chip DR disposed on the flexible substrate FPC.

The display panel 10 may include a display area DA in which an image is displayed and a peripheral area NDA, which is a non-display area and is disposed adjacent to the display area DA. The peripheral area NDA may be disposed adjacent to the display area DA and may surround (e.g., surround a periphery of) the display area DA.

A plurality of pixels, ones of which are electrically connected to a scan line extending in a first direction D1 and a data line extending in a second direction D2 crossing the first direction D1, may be disposed in the display area DA. Each of the pixels may emit red, green, blue, or white light and may include, for example, organic light emitting diodes.

A driving circuit and wirings for driving the pixels may be disposed in the peripheral area NDA.

A pad portion PAD at where the flexible substrate FPC connects to the display panel 10 may be formed at a side of the peripheral area NDA. The pad portion PAD may include a plurality of electrodes. The electrodes of the pad portion PAD are not covered by an insulation layer to be exposed (e.g., the electrodes of the pad portion PAD are exposed through the insulation layer) so that the electrodes of the pad portion PAD may be electrically connected to the flexible substrate FPC. A power source, such as a first power voltage ELVDD and a second power voltage ELVSS, a vertical synchronization signal, a horizontal synchronization signal, a mission control signal, a clock signal, a data signal, etc. may be provided through the flexible substrate FPC to the electrodes and to the driving circuit and the pixels.

The flexible substrate FPC may be a flexible printed circuit board. The driving chip DR may be an IC chip mounted on the flexible substrate FPC. In some example embodiments, the driving chip may be an IC chip mounted on a printed circuit board connected to the flexible substrate FPC.

The display panel 10 may be a flexible display panel. The peripheral area NDA where the pad portion PAD is disposed may be folded along the first direction D1 and disposed on a back surface of the display panel 10. Therefore, the peripheral area (e.g., the bezel) NDA, which is the non-display area of the display apparatus, is reduced. Here, the display panel 10 may include a flexible base substrate.

Figure 2:
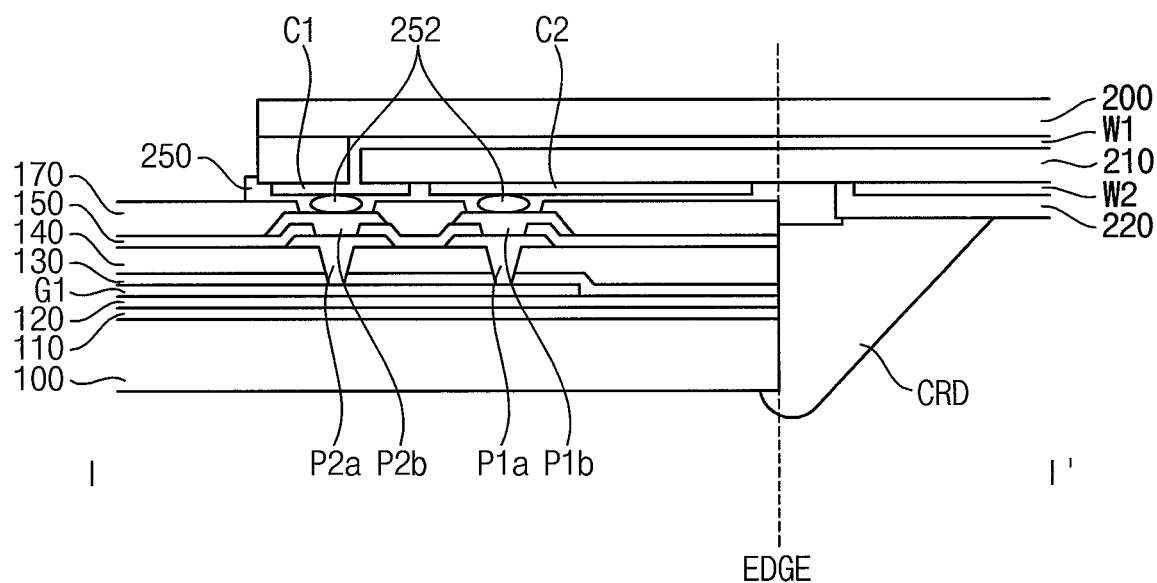
FIG. 2 is a cross-sectional view taken along the line I-I' of FIG. 1.

FIG. 2 is a cross-sectional view taken along the line I-I' of FIG. 1.

Referring to FIGS. 1 and 2, the display panel 10 of the display apparatus may include a base substrate (e.g., a flexible base substrate) 100, a buffer layer 110, a first insulation layer 120, a first gate layer including a gate line G1, a second insulation layer 130, a third insulation layer 140, a first SD layer including a first_a pad electrode P1a and a second_a pad electrode P2a, a fourth insulation layer 150, a second SD layer including a first_b pad electrode P1b and a second_b pad electrode P2b, and a sixth insulation layer 170.

The buffer layer 110 may be disposed on the base substrate 100. The first insulation layer 120 may be disposed on the buffer layer 110. The first gate layer including the gate line G1 may be disposed on the first insulation layer 120. The second insulation layer 130 may be disposed on the first insulation layer 120 on which the first gate layer is disposed (e.g., the second insulation layer 130 may be disposed over the first gate layer). The third insulation layer 140 may be disposed on the second insulation layer 130.

The first SD layer including the first_a pad electrode P1a and the second_a pad electrode P2a may be disposed on the third insulation layer 140. The first_a pad electrode P1a and the second_a pad electrode P2a may be electrically connected to the gate line G1 through a contact opening (e.g., a contact hole) formed through the second and third insulation layers 130 and 140.

The fourth insulation layer 150 may be disposed on the first SD layer. The second SD layer including the first_b pad electrode P1b and the second_b pad electrode P2b may be disposed on the fourth insulation layer 150. The first_b pad electrode P1b and the second_b pad electrode P2b may be electrically connected to the first_a pad electrode P1a and the second_a pad electrode P2a, respectively, through contact openings (e.g., contact holes) formed through the fourth insulation layer 150. The sixth insulation layer 170 may be disposed on the second SD layer. The sixth insulation layer 170 may have openings exposing the first_b pad electrode P1b and the second_b pad electrode P2b, respectively.

The flexible substrate FPC may include a first film layer 200, a first wiring layer W1, a second film layer 210, a second wiring layer W2, and a third film layer 220.

The first film layer 200 may be a base film of the flexible substrate FPC. The first film layer 200 may include an insulation material, such as a resin.

The first wiring layer W1 may be disposed on the first film layer 200. The first wiring layer W1 may be a conductive layer and may have a plurality of wirings.

The second film layer 210 may be disposed on the first film layer 200 on which the first wiring layer W1 is disposed (e.g., the second film layer 210 may cover the first wiring layer W1). The second film layer 210 may include an insulation material, such as a resin or the like.

The second wiring layer W2 may be a conductive layer and may have a plurality of wirings, a first contacting portion C1, and a second contacting portion C2. wiring layer W2 may be disposed on the second film layer 210.

The third film layer 220 may be disposed on the second wiring layer W2. The first film layer 200 may include an insulation material, such as a resin or the like. The third film layer 220 may expose a portion of the second wiring layer W2 so that the pad portion PAD of the display panel 10 may be electrically connected to the first contacting portion C1 and the second contacting portion C2 of the second wiring layer W2.

A conductive member 250 may be disposed between the pad portion PAD of the display panel 10 and the flexible substrate FPC. The conductive member 250 may attach the flexible substrate FPC to the display panel 10 and may electrically connect the electrodes of the pad portion PAD to circuits of the flexible substrate FPC. The conductive member 250 may be an anisotropic conductive film (ACF) having a plurality of conductive balls 252.

A covering part CRD may be disposed on a side surface of the display panel 10. The side surface of the display panel 10 is an edge EDGE. The covering part CRD may cover the side surface and may cover a portion of the exposed conductive member 250. Thus, the covering part CRD may contact a side surface and a portion of a lower surface of the display panel 10, the conductive member 250, and the third film layer 220 of the flexible substrate FPC. The covering part CRD may include a resin.

The driving chip DR may be mounted on the flexible substrate FPC. For example, the driving chip DR may be electrically connected to the second wiring layer W2 through an opening of the third film layer 220. In addition, the driving chip DR may be electrically connected to the first wiring layer W1 through an opening in the first film layer 200.

In some example embodiments, the wirings of the second wiring layer W2 are cut at an area corresponding to the edge EDGE, but the wirings of the second wiring layer W2 may be electrically connected to the wirings of the first wiring layer W1 through a contact opening (e.g., a contact hole) formed through the second film layer 210.

Figure 3:
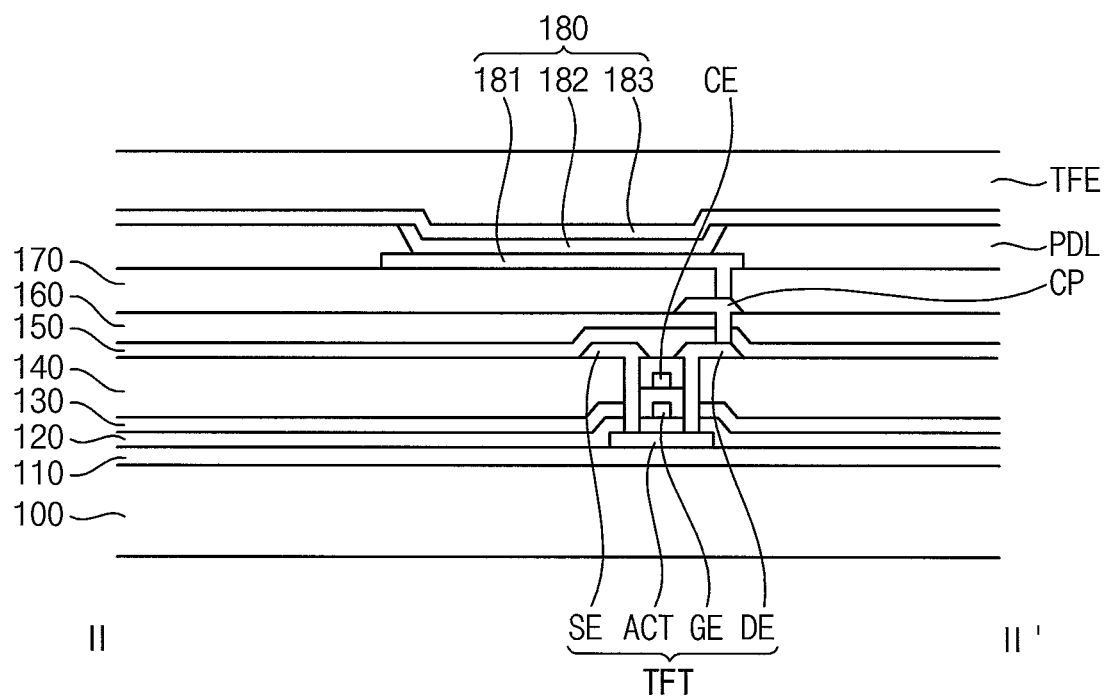
FIG. 3 is a cross-sectional view taken along the line II-II' of FIG. 1.

FIG. 3 is a cross-sectional view taken along the line II-II' of FIG. 1.

Referring to FIGS. 1 and 3, in the display area DA, the display apparatus may include the base substrate 100, the buffer layer 110, the first insulation layer 120, the second insulation layer 130, the third insulation layer 140, the fourth insulation layer 150, the fifth insulation layer 160, the sixth insulation layer 170, a pixel defining layer PDL, a light emitting structure 180, and a thin film encapsulation layer TFE. The light emitting structure 180 may include a first electrode 181, an emission layer (e.g., a light emitting layer) 182, and a second electrode 183.

The base substrate 100 may include (e.g., may be formed of) a flexible material. For example, the base substrate 100 may be formed of a flexible plastic material, such as polyimide. However, exemplary embodiments of the present invention are not limited thereto. According to other exemplary embodiments, the flexible plastic material may include polyethersulfone (PES), polyacrylate (PAR), polyetherimide (PEI), polyethylene naphthalate (PEN), polyethylene terephthalate (PET), polyphenylene sulfide (PPS), polyarylate, polyimide, polycarbonate (PC), TAC, cellulose acetate propionate (CAP), cyclic olefin polymer, cyclic olefin copolymer, etc.

The buffer layer 110 may prevent (or substantially reduce) diffusion of metal atoms and/or impurities from the base substrate 100 to an active pattern ACT and the light emitting structure 180. The buffer layer 110 may also adjust a heat transfer rate of a successive crystallization process to form the active pattern ACT to thereby obtain a substantially uniform active pattern ACT. Because the base substrate 100 may have a relatively irregular surface, the buffer layer 110 may improve flatness of the surface of the base substrate 100 (e.g., the buffer layer 110 may be a planarization layer). According to a type of the base substrate 100, a plurality of buffer layers may be provided on the base substrate 100, or the buffer layer may be omitted. For example, the buffer layer 110 may include an organic material or an inorganic material.

The active pattern ACT may be disposed on the buffer layer 110. The active pattern ACT may include amorphous silicon or polycrystalline silicon. In some example embodiments, the active pattern ACT may include an oxide of at least one substance selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The active pattern ACT may include a channel region, a source region, and a drain region doped with an impurity.

The first insulation layer 120 may be disposed on the buffer layer 110. The first insulation layer 120 may be uniformly (or substantially uniformly) formed on the buffer layer 110 along a profile of the active pattern ACT. The first insulation layer 120 may include a silicon compound, metal oxide, etc.

The first gate layer including a gate electrode GE may be disposed on the first insulation layer 120. The gate electrode GE may overlap the active pattern ACT. The first gate layer may be formed using metal, an alloy, a metal nitride, a conductive metal oxide, a transparent conductive material, etc.

The second insulation layer 130 may be disposed on the first insulation layer 120 on which the first gate layer is disposed. For example, the second insulation layer 130 may be uniformly (or substantially uniformly) formed on the first insulation layer 120 along a profile of the first gate layer. In some embodiments, the second insulation layer 130 may have a substantially small thickness such that a stepped portion may be formed at a portion of the second insulation layer 130 adjacent to the first gate layer. In some example embodiments, the second insulation layer 130 may have a relatively large thickness to sufficiently cover the active pattern so that the second insulation layer 130 may have a substantially level surface. The second insulating layer 130 may include a silicon compound, a metal oxide, or the like. The second insulating layer 130 may be formed of a plurality of layers.

A second gate layer including a storage electrode CE may be disposed on the second insulation layer 130. The storage electrode CE may form a storage capacitor with (e.g., may extend from) the gate electrode GE. The second gate layer may be formed using metal, an alloy, a metal nitride, a conductive metal oxide, a transparent conductive material, etc.

The third insulation layer 140 may be disposed on the second insulation layer 130 on which the second gate layer is disposed. For example, the third insulation layer 140 may sufficiently cover the second gate layer on the second insulation layer 130 and may have a substantially planar top surface without creating a step portion adjacent to the gate electrode GE. In some example embodiments, the third insulation layer 140 may cover the second gate layer on the second insulation layer 130 and may have substantially uniform thickness along a profile of the second gate layer. The third insulation layer 140 may include a silicon compound, a metal oxide, or the like. The third insulation layer 140 may be formed of a plurality of layers.

The first SD layer including a source electrode SE and a drain electrode DE may be disposed on the third insulation layer 140. The first SD layer may include (or may be formed of) metal, an alloy, a metal nitride, a conductive metal oxide, a transparent conductive material, etc. The source electrode SE may be electrically connected to the source region of the active pattern ACT through a contact opening (e.g., a contact hole) formed through the first-third insulation layers 120, 130, and 140. The drain electrode DE may be electrically connected to the drain region of the active pattern ACT through a contact opening (e.g., a contact hole) formed through the first-third insulating layers 120, 130, and 140.

A thin film transistor TFT may include the active pattern ACT, the gate electrode GE, the source electrode SE, and the drain electrode DE.

The fourth insulation layer 150 may be disposed on the third insulation layer 140 on which the thin film transistor TFT is disposed. The fourth insulation layer 150 may include (or may be formed of) an inorganic material, such as a silicon compound, metal, a metal oxide, etc.

The fifth insulation layer 160 may be disposed on the fourth insulation layer 150. The fifth insulation layer 160 may have a single-layer structure or a multi-layer structure including a plurality of insulation films. The fifth insulation layer 160 may include (or may be formed of) an organic material. For example, the fifth insulation layer 160 may include a photoresist, an acryl-based resin, a polyimide-based resin, a polyamide-based resin, a siloxane-based resin, etc. These may be used alone or in a combination.

The second SD layer including a contact pad CP may be disposed on the fifth insulation layer 160. The contact pad CP may be electrically connected to the drain electrode DE through a contact opening (e.g., a contact hole) formed through the fourth and fifth insulation layers 150 and 160. The second SD layer may include (or may be formed of) metal, an alloy, a metal nitride, a conductive metal oxide, a transparent conductive material, etc.

The sixth insulation layer 170 may be disposed on the fifth insulation layer 160 on which the contact pad CP is disposed. The sixth insulation layer 170 may have a single-layer structure or a multi-layer structure including a plurality of insulation films. The sixth insulation layer 170 may include (or may be formed of) an organic material. For example, the sixth insulation layer 170 may include a photoresist, an acryl-based resin, a polyimide-based resin, a polyamide-based resin, a siloxane-based resin, etc. In some example embodiments, the sixth insulation layer 170 may be formed using an inorganic material, such as a silicon compound, metal, or a metal oxide.

The light emitting structure 180 may include the first electrode 181, the emission layer 182, and the second electrode 183.

The first electrode 181 may be disposed on the sixth insulation layer 170. The first electrode 181 may be electrically connected to the contact pad CP through a contact opening (e.g., a contact hole) formed through the sixth insulation layer 170.

The first electrode 181 may include a reflective material or a transmissive material in accordance with the emission type of the display apparatus. For example, the first electrode 181 may include (or may be formed of) aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination. In example embodiments, the first electrode 181 may have a single-layer structure or a multi-layer structure, which may include a metal film, an alloy film, a metal nitride film, a conductive metal oxide film, and/or a transparent conductive film.

The pixel defining layer PDL may be disposed on the sixth insulation layer 170 on which the first electrode 181 is disposed. The pixel defining layer PDL may include (or may be formed of) an organic material. For example, the pixel defining layer PDL may include a photoresist, an acryl-based resin, a polyimide-based resin, a polyamide-based resin, a siloxane-based resin, etc. In some example embodiments, an opening which exposes the first electrode 181 may be formed by etching the pixel defining layer PDL.

The light emitting layer 182 may be disposed on the first electrode 181 exposed through the opening in the pixel defining layer PDL. In addition, the light emitting layer 182 may extend onto a sidewall of the opening in the pixel defining layer PDL. In some example embodiments, the light emitting layer 182 may include an organic light emitting layer (EL), a hole injection layer (HIL), a hole transfer layer (HTL), an electron transfer layer (ETL), an electron injection layer (EIL), etc. In some example embodiments, the hole injection layer, the hole transport layer, the electron transport layer, and the electron injection layer may be formed in common to correspond to a plurality of pixels, while the organic emission layer may be separately formed for each of the pixels. In some example embodiments, a plurality of organic light emitting layers may be formed of light emitting materials for generating different colors of light, such as a red color of light, a green color of light, and a blue color of light in accordance with color pixels of the display device. In some example embodiments, the organic light emitting layer of the light emitting layer 182 may include a plurality of stacked light emitting materials for generating a red color of light, a green color of light, and a blue color of light to thereby emit a white color light. In this embodiment, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. For example, the second electrode 183 may include (or may be formed of) aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination. In example embodiments, the second electrode 183 may also have a single-layer structure or a multi-layer structure, which may include a metal film, an alloy film, a metal nitride film, a conductive metal oxide film, and/or a transparent conductive film.

The thin film encapsulation layer TFE may be disposed on the second electrode 183. The thin film encapsulation layer TFE may prevent (or substantially prevent) penetration of moisture and oxygen from outside. The thin film encapsulation layer TFE may include at least one organic layer and at least one inorganic layer. The at least one organic layer and the at least one inorganic layer may be alternately stacked with each other. For example, the thin film encapsulation layer TFE may include a plurality of (e.g., two) inorganic layers with one organic layer therebetween but is not limited thereto. In some example embodiments, a sealing substrate may be provided for shielding outside air and moisture from penetrating into the display apparatus instead of the thin film encapsulation layer TFE.

Figure 4A:
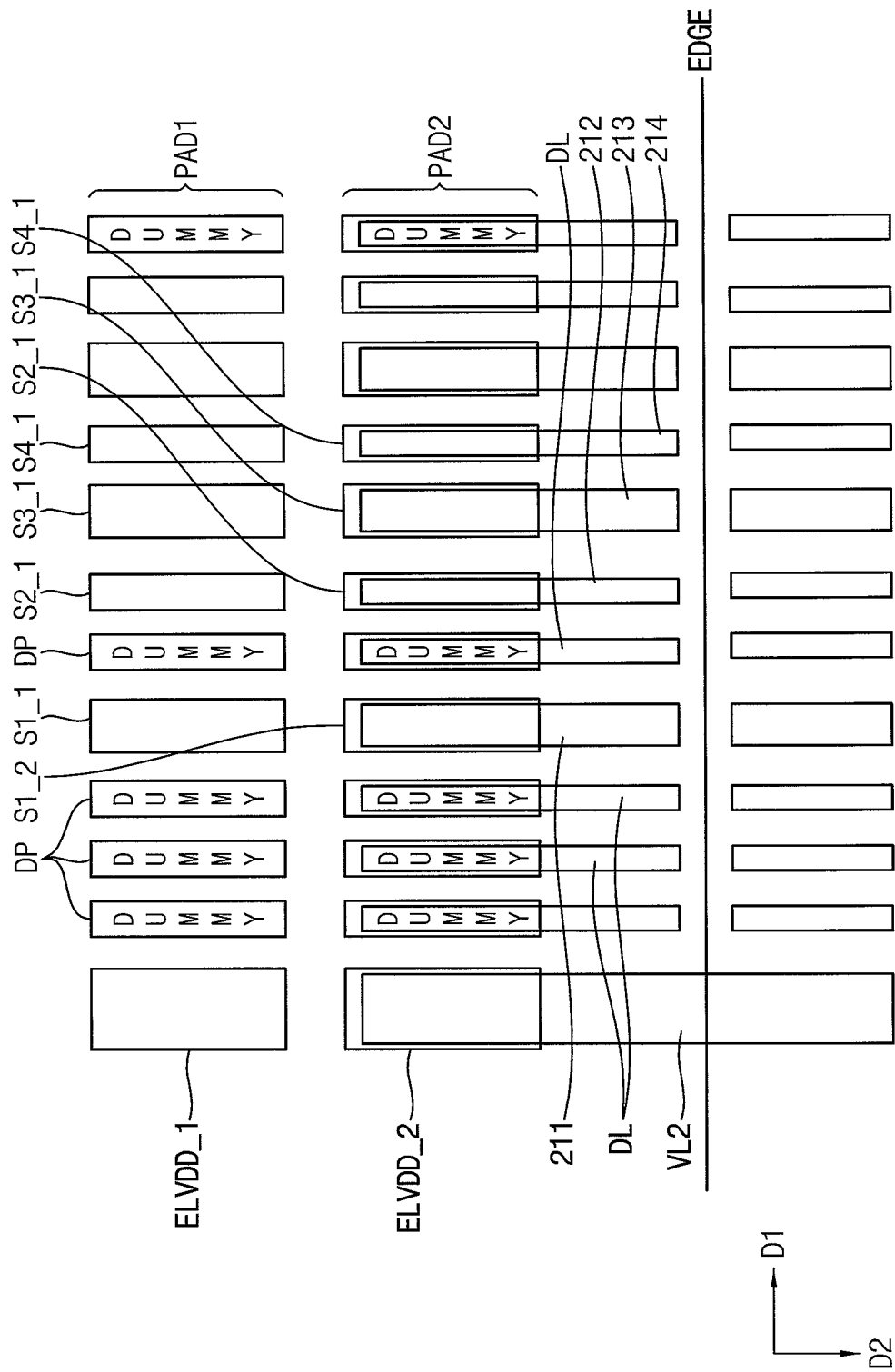
FIG. 4A is a diagram illustrating a connection relationship of a first wiring layer of a flexible substrate at the area 'A' of FIG. 1.

FIG. 4A is a diagram illustrating a connection relationship of the first wiring layer W1 on the flexible substrate FPC at the area 'A' of FIG. 1. FIG. 4B is a diagram illustrating a connection relationship of the second wiring layer W2 on the flexible substrate FPC at the area 'A' of FIG. 1.

Referring to FIGS. 2, 4A, and 4B, the pad portion PAD may include a first pad portion PAD1 and a second pad portion PAD2. The first pad portion PAD1 may include a plurality of dummy electrodes DP, a first_first power electrode ELVDD_1, a first_first pad electrode S1_1, a second_first pad electrode S2_1, a third_first pad electrode S3_1, and a fourth_first pad electrode S4_1. The second pad portion PAD2 may include a plurality of dummy electrodes DP, a first_second power electrode ELVDD_2, a first_second pad electrode S1_2, a second_second pad electrode S2_2, a third_second pad electrode S3_2, and a fourth_second pad electrode S4_2.

Each of the dummy electrodes DP may be a dummy electrode to which no signal (e.g., no special signal) or voltage is applied.

The first power voltage ELVDD may be applied to the first_first power electrode ELVDD_1 and the first_second power electrode ELVDD_2.

A signal, such as a vertical synchronizing signal, a horizontal synchronizing signal, a light emission control signal, a clock signal, and the like, may be applied to the first_first pad electrode S1_1, the second_first pad electrode S2_1, the third_first pad electrode S3_1, and the fourth_first pad electrode S4_1. The signals may have a negative (−) or positive (+) voltage.

A signal or voltage identical to (or substantially similar to) the signal or voltage applied to the first_first pad electrode S1_1, the second_first pad electrode S2_1, the third_first pad electrode S3_1, and the fourth_first pad electrode S4_1 may be applied to the first_second pad electrode S1_2, the second_second pad electrode S2_2, the third_second pad electrode S3_2, and the fourth_second pad electrode S4_2, respectively.

The electrodes of the first pad portion PAD1 may be arranged in (e.g., arranged adjacent each other in) the first direction D1. One or a plurality of the dummy electrodes DP may be disposed between the electrodes to which the same voltage or signal as the first_first power electrode ELVDD_1, the first_first pad electrode S1_1, the second_first pad electrode S2_1, the third_first pad electrode S3_1, or the fourth_first pad electrode S4_1 is applied. In some embodiments, the electrodes to which the same voltage or signal are applied may be disposed adjacent to (e.g., directly adjacent to) each other.

The second pad portion PAD2 may be spaced from (e.g., spaced apart from) the first pad portion PAD1 in the second direction D2, which is perpendicular to the first direction D1, and may extend in the first direction D1. The electrodes of the second pad portion PAD2 may be arranged in (e.g., arranged adjacent each other in) the first direction D1. One or a plurality of the dummy electrodes DP may be disposed between the electrodes to which the same voltage or signal as the first_second power electrode ELVDD_2, the first_second pad electrode S1_2, the second_second pad electrode S2_2, the third_second pad electrode S3_2, or the fourth_second pad electrode S4_2 is applied. In some embodiments, the electrodes to which the same voltage or signal is applied may be disposed adjacent to (e.g., directly adjacent to) each other.

In FIG. 4A, wirings of the second wiring layer W2 of the flexible substrate FPC are described. For example, the second wiring layer W2 may include a first_second power line VL2, a plurality of dummy lines DL, a first_second wiring 211, a second_second wiring 212, a third_second wiring 213, and a fourth_second wiring 214.

The first_second power line VL2 may contact the conductive ball 252 of the conductive member 250 and may be electrically connected to the first power electrode ELVDD_2 (see, e.g., FIG. 2).

The dummy lines DL may include a first dummy line (e.g., the top portion of the dummy lines in FIG. 4A in the second direction D2) and a second dummy line (e.g., the bottom portion of the dummy lines in FIG. 4A in the second direction D2), which is spaced from the first dummy line and extends in a same direction so that the first and second dummy lines are formed along a same line. The first dummy line of the dummy lines DL may contact the conductive ball 252 of the conductive member 250 and may be electrically connected to the dummy electrode DP.

In a plan view, the edge EDGE of the base substrate 100 may be disposed between the first dummy line and the second dummy line of the dummy line DL. For example, the dummy line DL is cut at where it overlaps the edge EDGE of the base substrate 100 so that the dummy line DL does not overlap the edge EDGE.

A gap may be formed between the first dummy line and the second dummy line, and the gap between the first dummy line and the second dummy line may overlap the edge EDGE of the base substrate 100.

The first_second wiring 211 may include a first_second_first wiring (e.g., the top portion in FIG. 4A) and a first_second_second wiring (e.g., the bottom portion in FIG. 4A) which is spaced from the first_second_first wiring and extends in a same direction so that the first_second_first wiring and the first_second_second wiring are formed along a same line. The first_second_first wiring of the first_second wiring 211 may contact the conductive ball 252 of the conductive member 250 to be electrically connected to the first_second pad electrode S1_2.

In a plan view, the edge EDGE of the base substrate 100 may be disposed between the first_second_first wiring and first_second_second wiring of the first_second wiring 211. For example, the first_second wiring 211 is cut at where it overlaps the edge EDGE of the base substrate 100 so that the edge EDGE and the first_second wiring 211 do not overlap each other.

A gap may be formed between the first_second_first wiring and the first_second_second wiring, and the gap between the first_second_first wiring and the first_second_second wiring may overlap the edge EDGE of the base substrate 100.

The second_second wiring 212 may include a second_second_first wiring (e.g., the top portion in FIG. 4A) and a second_second_second wiring (e.g., the bottom portion in FIG. 4A) which is spaced from the second_second_first wiring and extends in a same direction so that the second_second_first wiring and the second_second_second wiring are formed along a same line. The second_second_first wiring of the second_second wiring 212 may contact the conductive ball 252 of the conductive member 250 to be electrically connected to the second_second pad electrode S2_2.

In a plan view, the edge EDGE of the base substrate 100 may be disposed between the second_second_first wiring and second_second_second wiring of the second_second wiring 212. For example, the second_second wiring 212 is cut at where it overlaps the edge EDGE of the base substrate 100 so that the edge EDGE and the second_second wiring 212 do not overlap each other. A gap may be formed between the second_second_first wiring and the second_second_second wiring, and the gap between the second_second_first wiring and the second_second_second wiring may overlap the edge EDGE of the base substrate 100.

The third_second wiring 213 may include a third_second_first wiring (e.g., the top portion in FIG. 4A) and a third_second_second wiring (e.g., the bottom portion in FIG. 4A) which is spaced from the third_second_first wiring and extends in a same direction so that the third_second_first wiring and the third_second_second wiring are formed along a same line. The third_second_first wiring of the third_second wiring 213 may contact the conductive ball 252 of the conductive member 250 to be electrically connected to the third_second pad electrode S3_2.

In a plan view, the edge EDGE of the base substrate 100 may be disposed between the third_second_first wiring and third_second_second wiring of the third_second wiring 213. For example, the third_second wiring 213 is cut at where it overlaps the edge EDGE of the base substrate 100 so that the edge EDGE and the third_second wiring 213 do not overlap each other. A gap may be formed between the third_second_first wiring and the third_second_second wiring, and the gap between the third_second_first wiring and the third_second_second wiring may overlap the edge EDGE of the base substrate 100.

The fourth_second wiring 214 may include a fourth_second_first wiring (e.g., the top portion in FIG. 4A) and a fourth_second_second wiring (e.g., the bottom portion in FIG. 4A) which is spaced from the fourth_second_first wiring and extends in a same direction so that the fourth_second_first wiring and the fourth_second_second wiring are formed along a same line. The fourth_second_first wiring of the fourth_second wiring 214 may contact the conductive ball 252 of the conductive member 250 to be electrically connected to the fourth_second pad electrode S4_2.

In a plan view, the edge EDGE of the base substrate 100 may be disposed between the fourth_second_first wiring and fourth_second_second wiring of the fourth_second wiring 214. For example, the fourth_second wiring 214 is cut at where it overlaps the edge EDGE of the base substrate 100 so that the edge EDGE and the fourth_second wiring 214 do not overlap each other. A gap may be formed between the fourth_second_first wiring and the fourth_second_second wiring, and the gap between the fourth_second_first wiring and the fourth_second_second wiring may overlap the edge EDGE of the base substrate 100.

Wirings of the first wiring layer W1 of the flexible substrate FPC are described in FIG. 4B. For example, the first wiring layer W1 may include a first_first power line VL1, a plurality of dummy lines DL, a first_first wiring 201, a second_first wiring 202, a third_first wiring 203, and a fourth_first wiring 204.

The wirings of the first wiring layer W1 are electrically connected to a first contacting portion C1 (see, e.g., FIG. 2) of the second wiring layer W2 and may be electrically connected through the first contacting portion C1 and the conductive ball 252 of the conductive member 250 to a corresponding pad electrode.

According to example embodiments of the present invention, signal wirings of the second wiring layer W2 adjacent to the side surface of the base substrate 100 are cut at an area corresponding to the edge EDGE of the base substrate 100. Therefore, a short circuit between the signal wirings due to, for example, damage to an insulation structure between the signal wirings caused by a material, for example, a conductive material, flowing out from the side surface of the base substrate 100 under high temperature and high humidity conditions can be prevented or mitigated.

Figure 5B:
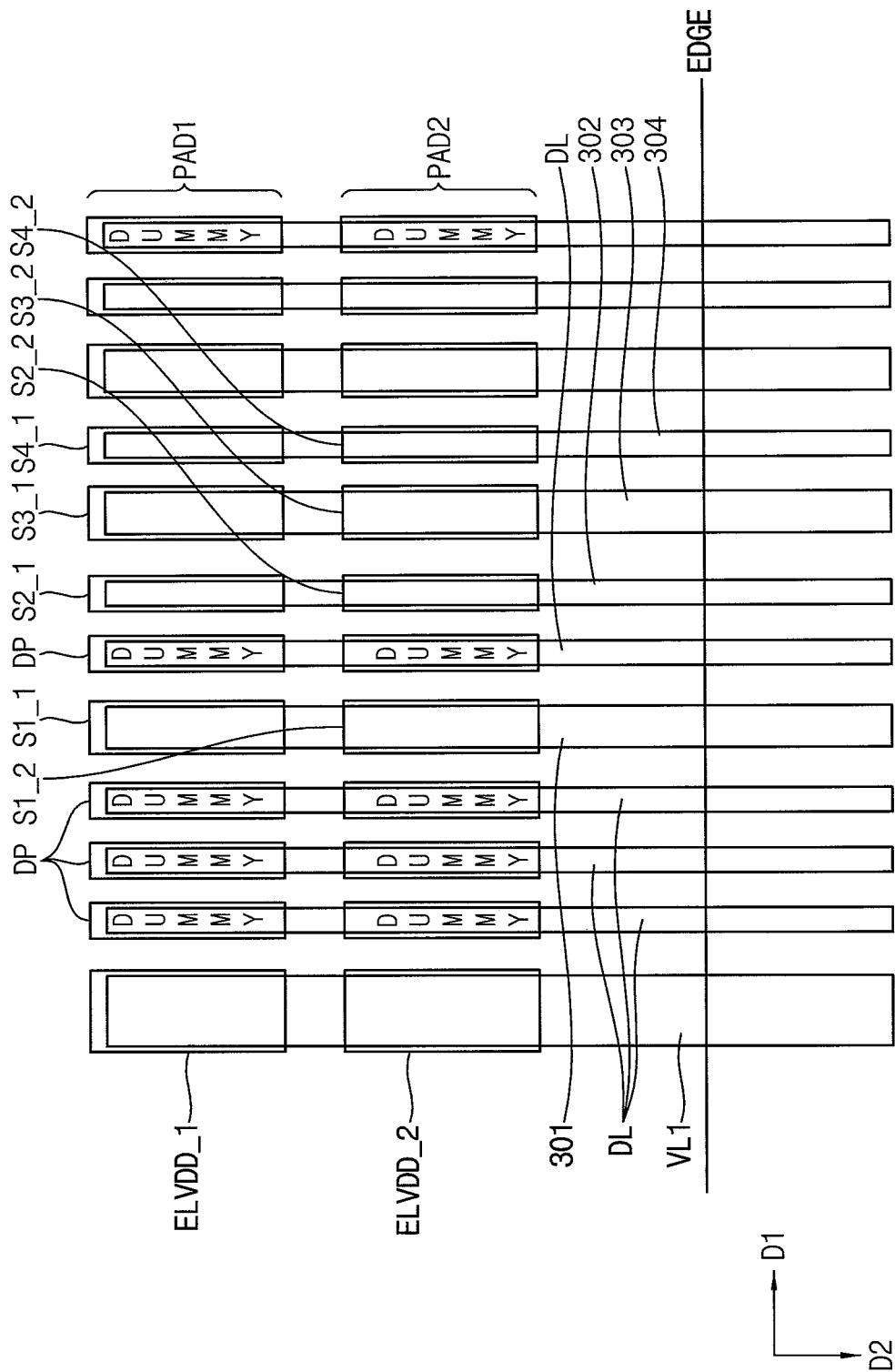
FIG. 5B is a diagram illustrating a connection relationship of a second wiring layer of the flexible substrate of the display apparatus shown in FIG. 5A.

FIG. 5A is a diagram illustrating a connection relationship of a first wiring layer of a flexible substrate of a display apparatus according to an example embodiment of the present invention. FIG. 5B is a diagram illustrating a connection relationship of a second wiring layer of the flexible substrate of the display apparatus shown in FIG. 5A.

Referring to FIGS. 5A and 5B, the display apparatus is substantially the same as the display apparatus shown in FIGS. 1-4 except that a first_second wiring 311, a second_second wiring 312, a third_second wiring 313, and a fourth_second wiring 314 are not cut. Therefore, repeated explanations of the same or substantially similar configurations may be omitted.

A dummy line DL may include a first dummy line and a second dummy line. The second dummy line is spaced from the first dummy line and extends in a same direction so that the first and the second dummy line are formed along a same line. Thus, in a plan view, the dummy line DL may be cut at an area overlapping the edge EDGE of the base substrate 100 so that the edge EDGE and the dummy line DL may not overlap each other. Therefore, a gap is formed between the first dummy line and the second dummy line, and the gap between the first and second dummy lines may overlap the edge EDGE of the base substrate 100 in a plan view.

The first_second wiring 311, the second_second wiring 312, the third_second wiring 313, and the fourth_second wiring 314 may not be cut at the edge EDGE. Thus, in a plan view, the first_second wirings 311, the second_second wirings 312, the third_second wirings 313, and the fourth_second wirings 314 may overlap the edge EDGE.

According to the above-described example embodiment of the present invention, the dummy lines DL of the second wiring layer W2 adjacent to the side surface of the base substrate 100 are cut at an area corresponding to the edge EDGE of the base substrate 100. Therefore, a short circuit between the dummy line DL and signal wirings adjacent to the dummy line DL due to, for example, a material, such as a conductive material, flowing out from the side surface of the base substrate 100 under high temperature and high humidity conditions can be prevented or mitigated.

Figure 6B:
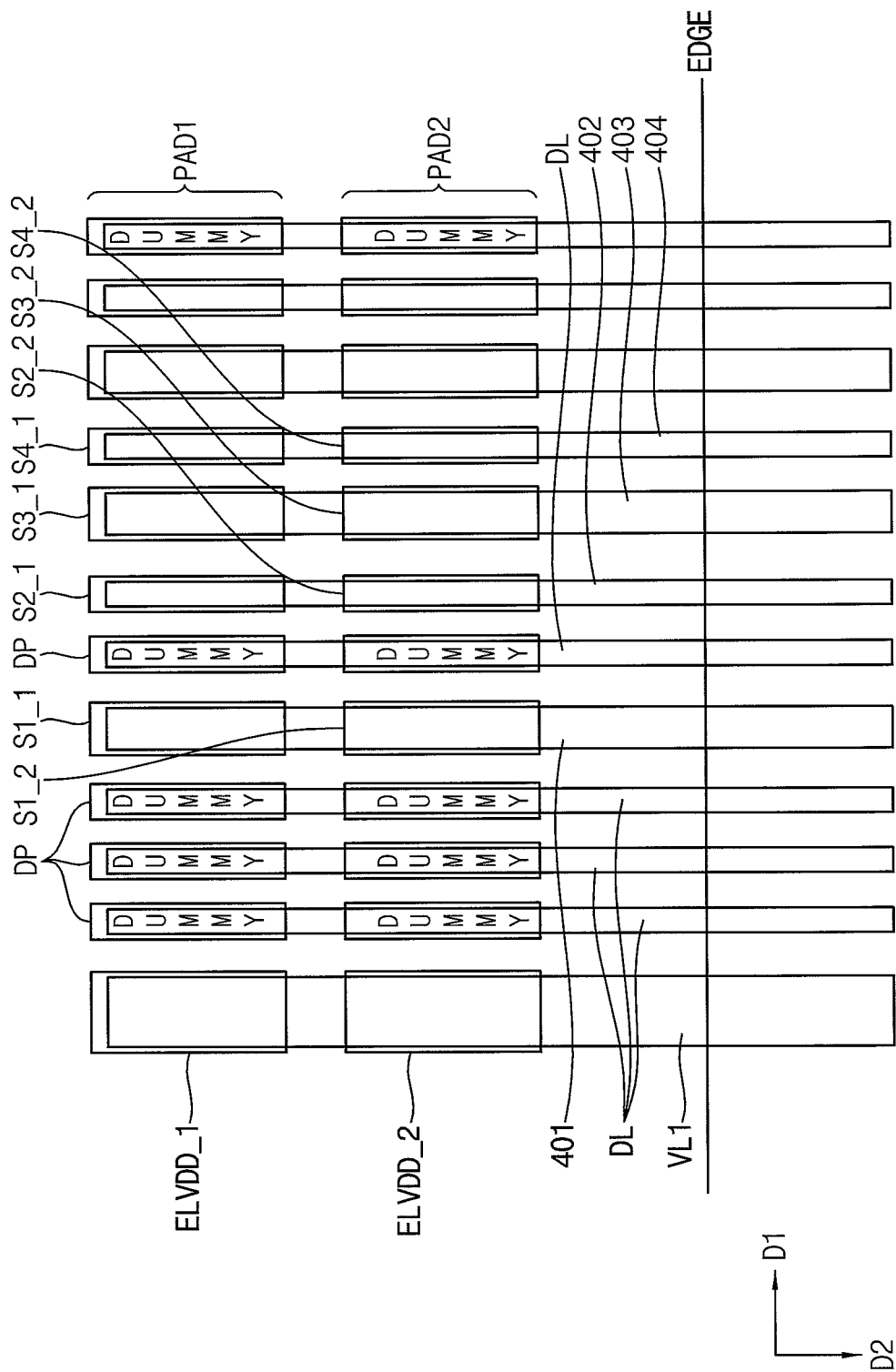
FIG. 6B is a diagram illustrating a connection relationship of a second wiring layer of the flexible substrate of the display apparatus shown in FIG. 6A.

FIG. 6A is a diagram illustrating a connection relationship of a first wiring layer of a flexible substrate of a display apparatus according to an example embodiment of the present invention. FIG. 6B is a diagram illustrating a connection relationship of a second wiring layer of the flexible substrate of the display apparatus shown in FIG. 6A.

Referring to FIGS. 6A and 6B, the display apparatus may be substantially same as the display apparatus shown in FIGS. 1-4 except that a dummy line is not cut. Therefore, repeated explanations of the same or substantially similar configurations may be omitted.

Each of a first_second wiring 311, a second_second wiring 312, a third_second wiring 313, and a fourth_second wiring 314 may include a first wiring and a second wiring spaced from the respective first wiring. Thus, in a plan view, each of the first_second wiring 311, the second_second wiring 312, the third_second wiring 313, and the fourth_second wiring 314 may be cut at an area corresponding to the edge EDGE of the base substrate 100 so that the first_second wiring 311-the fourth_second wiring 314 may not overlap the edge EDGE.

The dummy line DL may not be cut at the edge EDGE. Thus, in a plan view, the dummy line DL may overlap (e.g., may extend over) the edge EDGE.

According to the above-described example embodiment of the present invention, signal wirings of the second wiring layer W2 adjacent to a side surface of the base substrate 100 are cut at an area corresponding to the edge EDGE of the base substrate 100. Therefore, a short circuit between adjacent signal wirings due to, for example, damage to an insulation structure between the signal wirings due to a material, such as a conductive material, flowing out from the side surface of the base substrate 100 under high temperature and high humidity conditions can be prevented or mitigated.

In addition, any material that may flow out of the base substrate 100 may be blocked by the dummy line DL. Accordingly, the above-described defects may be prevented or mitigated.

Figure 7:
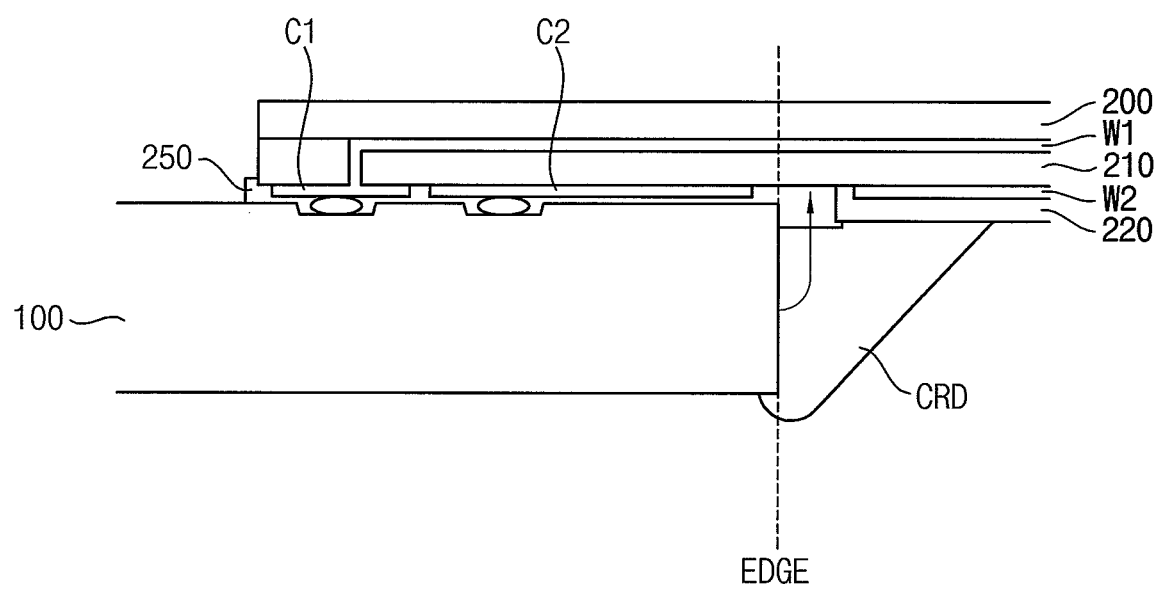
FIG. 7 is a diagram illustrating a display apparatus according to an example embodiment of the present invention.

FIG. 7 is a diagram illustrating a display apparatus according to an example embodiment of the present invention.

Referring to FIG. 7, when the display apparatus is driven in a high temperature and high humidity environment, a material promoting corrosion of metal may flow out from the side surface of the base substrate 100, and the material may be harmful to the wirings of the second wiring layer W2. The material may reach the wirings of the second wiring layer W2 from the side surface of the base substrate 100 through the covering part CRD and the conductive member 250 (see, e.g., the arrow in FIG. 7) Accordingly, in conventional display apparatuses, the wirings may be corroded due to the material flowing between adjacent wirings, and a short circuit may occur, causing a defective or abnormal driving phenomenon to occur.

For example, when the base substrate 100 is a flexible substrate including polyimide, a short circuit may relatively frequently occur between the wirings in high temperature and high humidity environments.

According to example embodiments of the present invention, because at least some of the wirings are cut at an area at where the material can affect the wirings, the above-described defects can be prevented or mitigated. In addition, the signal wiring(s) are cut or the dummy wiring is present in at where the material may flow so that the above-described defects may be prevented or mitigated.

According to example embodiments of the present invention, signal wirings and/or dummy lines of the second wiring layer adjacent to a side surface of the base substrate are cut at an area corresponding to the edge of the base substrate. Therefore, a short circuit between the signal wirings due to damage to an insulation structure caused by a material, for example, a conductive material, flowing out from the side surface of the base substrate under high temperature and high humidity conditions can be prevented or mitigated.

In addition, the material may be blocked (or substantially blocked) from further flowing by the dummy line. Accordingly, above-described defects may be prevented or further mitigated.

The foregoing exemplary embodiments are illustrative of the present invention and are not to be construed as limiting thereof. Although a few example embodiments of the present invention have been described, those skilled in the art will readily appreciate that many modifications thereto are possible without materially departing from the aspects and features of the present invention. Accordingly, all such modifications are intended to be included within the scope of the present invention. In the claims, means-plus-function clauses are intended to cover the structures described herein as performing the recited function(s) and not only structural equivalents but also equivalent structures. Therefore, it is to be understood that the foregoing is illustrative of the present invention, and the present invention is not to be construed as limited to the example embodiments disclosed, and modifications to the disclosed example embodiments, as well as other example embodiments, are intended to be included within the scope of the appended claims and their equivalents.

What is claimed is:

1. A display apparatus comprising:
   a display panel comprising a base substrate and a first pad electrode on a first pad portion of the base substrate;
   a flexible substrate connected to the first pad portion, the flexible substrate comprising:
     a first film layer; and
     a first wiring layer on the first film layer and comprising a first wiring, the first wiring comprising a first_first wiring and a first_second wiring, the first_first wiring and the first_second wiring extending in a same direction and along a same line, the first_first wiring and the first_second wiring being spaced from each other by a gap therebetween, the gap being at an edge of the base substrate in a plan view; and
   a driving chip electrically connected to the flexible substrate.

2. The display apparatus of claim 1, further comprising:
   a second wiring layer on the first film layer and comprising a wiring which is overlapped with the first_first wiring and the first_second wiring, and electrically connected to the first_first wiring.

3. The display apparatus of claim 2, wherein the first film layer is between the first wiring layer and the second wiring layer.

4. The display apparatus of claim 3, further comprising:
   a second film layer covering the first wiring layer; and
   a third film layer covering the second wiring layer.

5. The display apparatus of claim 4, wherein the first wiring layer is between the second wiring layer and the display panel.

6. The display apparatus of claim 1, wherein the first wiring layer further comprises a second wiring comprising a second_first wiring and a second_second wiring,
   the second_first wiring and the second_second wiring extend in a same direction and along a same line,
   the second_first wiring and the second_second wiring being spaced from each other by a gap therebetween, the gap being at the edge of the base substrate in a plan view.

7. The display apparatus of claim 6, wherein the first wiring is a dummy wiring and the second wiring is a signal wiring.

8. The display apparatus of claim 1, wherein the first wiring layer further comprises a second wiring which is in parallel with the first wiring, and overlaps the edge of the base substrate in a plan view.

9. The display apparatus of claim 8, wherein the first wiring layer is a dummy wiring,
and the second wiring is a signal wiring.

10. The display apparatus of claim 8, wherein the first wiring layer is a signal wiring,
and the second wiring is a dummy wiring.

11. The display apparatus of claim 1, further comprising a conductive member comprising a plurality of conductive balls and being between the flexible substrate and the first pad electrode,
   wherein the first wiring layer further comprises a first contacting portion contacting at least some of the conductive balls to be electrically connected to the first pad electrode.

12. The display apparatus of claim 1, further comprising a covering part which covers a side surface of the display panel.

13. The display apparatus of claim 1, wherein the flexible substrate further comprises a first power line to which a first power voltage is applied, and
   the first power line overlaps the edge of the base substrate in the plan view.

\* \* \* \* \*